United States Patent [19]
Raje

[11] Patent Number: 5,332,933
[45] Date of Patent: Jul. 26, 1994

[54] BIPOLAR-MOS CIRCUITS WITH DIMENSIONS SCALED TO ENHANCE PERFORMANCE

[75] Inventor: Prasad A. Raje, Fremont, Calif.

[73] Assignee: Hewlett-Packard Company, Palo Alto, Calif.

[21] Appl. No.: 6,418

[22] Filed: Jan. 21, 1993

[51] Int. Cl.$^5$ .......................................... H03K 19/01
[52] U.S. Cl. .................................. 307/446; 307/443; 307/482.1
[58] Field of Search ............... 307/443, 446, 475, 480, 307/482.1, 303.1; 364/491

[56] References Cited

U.S. PATENT DOCUMENTS

| | | | |
|---|---|---|---|
| 4,558,234 | 12/1985 | Suzuki et al. | 307/475 X |
| 4,703,203 | 10/1987 | Gallup et al. | 307/446 |
| 4,837,462 | 6/1989 | Watanabe et al. | 307/446 |
| 4,985,645 | 1/1991 | Tsutsui | 307/446 |
| 5,049,765 | 9/1991 | Young et al. | 307/475 X |
| 5,083,048 | 1/1992 | Kashimura | 307/446 X |

OTHER PUBLICATIONS

Prasad, Raje; "Design and Scaling of BiCMOS Circuits", Proceedings of International Conference on Computer Design (1992): pp. 234–238.

Prasad, Raje et al., "A New Methodology for Design of BiCMOS Gates and Comparison with CMOS", IEEE Transactions on Electron Devices, vol. 39, No. 2, Feb. 1992.

*Primary Examiner*—David R. Hudspeth

[57] ABSTRACT

An optimum ratio relating the characteristic dimensions of the MOS pull-up and the MOS pull-down devices of a logic circuit with one or more bipolar devices connected to an output of the circuit. This optimum ratio substantially minimizes the propagation delay of the circuit. The first preferred embodiment is shown in a BiNMOS circuit, and the second preferred embodiment is shown in a BiCMOS circuit.

14 Claims, 4 Drawing Sheets

BIPOLAR-MOS CIRCUITS WITH DIMENSIONS SCALED TO ENHANCE PERFORMANCE

BACKGROUND OF THE INVENTION

The present invention relates generally to logic circuits and more particularly to logic circuits with dimensions scaled for performance enhancement.

Tremendous effort has been spent to increase the speed of electronic circuits. One approach is to combine the strengths of Metal-Oxide-Semiconductor (MOS) and bipolar technologies. Typically, MOS devices control the logic of a circuit and bipolar devices increase the output current drive capability, which in turn increases the speed of the circuit. Commonly used circuits with such configurations are BiNMOS and BiCMOS circuits.

The configuration of a BiNMOS or a BiCMOS circuit involves a pull-up section and a pull-down section. The pull-up section "pulls the circuit up" so that the output voltage of the circuit is at a high logic level; the pull-down section "pulls the circuit down" so that the output voltage of the circuit is at a low logic level. Both the BiNMOS and the BiCMOS circuits have MOS devices in the pull-up and the pull-down sections. The main difference between the two types of circuits is that the BiCMOS circuit has bipolar devices in both the pull-up and the pull-down sections, whereas the BiNMOS circuit has bipolar devices only in the pull-up section.

Raje et al. in "A New Method for Design of BiCMOS Gates and Comparison with CMOS" have disclosed a method to increase the speed of a BiCMOS logic circuit. The method relates a characteristic dimension of the bipolar devices in the circuit to a characteristic dimension of the MOS devices in the circuit by a predetermined ratio. With the ratio, one only has to design either the MOS or the bipolar devices, and the other devices are automatically designed. However, there is still a need to further increase the speed of circuits with such configurations and to further reduce the complexity of designing such circuits.

SUMMARY OF THE INVENTION

The present invention provides a high-speed logic circuit with a MOS pull-up and a MOS pull-down device, and one or more bipolar devices that are connected to an output of the circuit. The speed of the circuit is achieved by relating a characteristic dimension of the MOS pull-up device to a characteristic dimension of the MOS pull-down device by an optimum ratio. This optimum ratio substantially maximizes the speed of the circuit. With this ratio, the design process of the circuit is simplified because by designing one of the devices, the characteristic dimensions of the remaining devices in the circuit are automatically determined.

One preferred embodiment of the invention is demonstrated in a BiNMOS circuit. It has a pull-up section with a MOS pull-up and a bipolar pull-up device, and a pull-down section with a MOS pull-down device. The bipolar pull-up device is connected between a first terminal and an output of the circuit.

The MOS pull-up device, characterized by a first dimension, drives the bipolar pull-up device. The MOS pull-up device also responds to an input signal forcing the bipolar pull-up device to provide a low resistance current path for establishing a first logic level at the output if the input signal assumes a second logic level.

The MOS pull-down device, characterized by a second dimension, is connected between the output of the circuit and a second terminal. The MOS pull-down device responds to the input signal to provide a low resistance current path for establishing the second logic level at the output if the input signal assumes the first logic level.

The first and the second dimension are related by an optimum ratio that substantially minimizes a propagation delay of the circuit.

Another preferred embodiment of the invention is demonstrated in a BiCMOS circuit. It has a pull-up section with a MOS pull-up and a bipolar pull-up device, and a pull-down section with a MOS pull-down and a bipolar pull-down device. The MOS devices drive the bipolar devices which are connected to an output of the circuit. A characteristic dimension of the MOS pull-up device is related to a characteristic dimension of the MOS pull-down device by another optimum ratio to substantially minimize a propagation delay of the circuit.

Other aspects and advantages of the present invention will become apparent from the following detailed description, taken in conjunction with the accompanying drawings, illustrating by way of example the principles of the invention.

DESCRIPTION OF THE PREFERRED EMBODIMENT

The present invention provides a high-speed logic circuit with a MOS pull-up device, a MOS pull-down device, and one or more bipolar devices which are connected to an output of the circuit. The speed is attained by selecting an optimum ratio that relates a characteristic dimension of the MOS pull-up device to a characteristic dimension of the MOS pull-down device. This optimum ratio relative to any other ratios substantially minimizes a propagation delay of the circuit. Based on the ratio, the design process of the circuit is simplified because by designing one of the devices, the characteristic dimensions of the remaining devices of the circuit are automatically determined.

Figure 1:
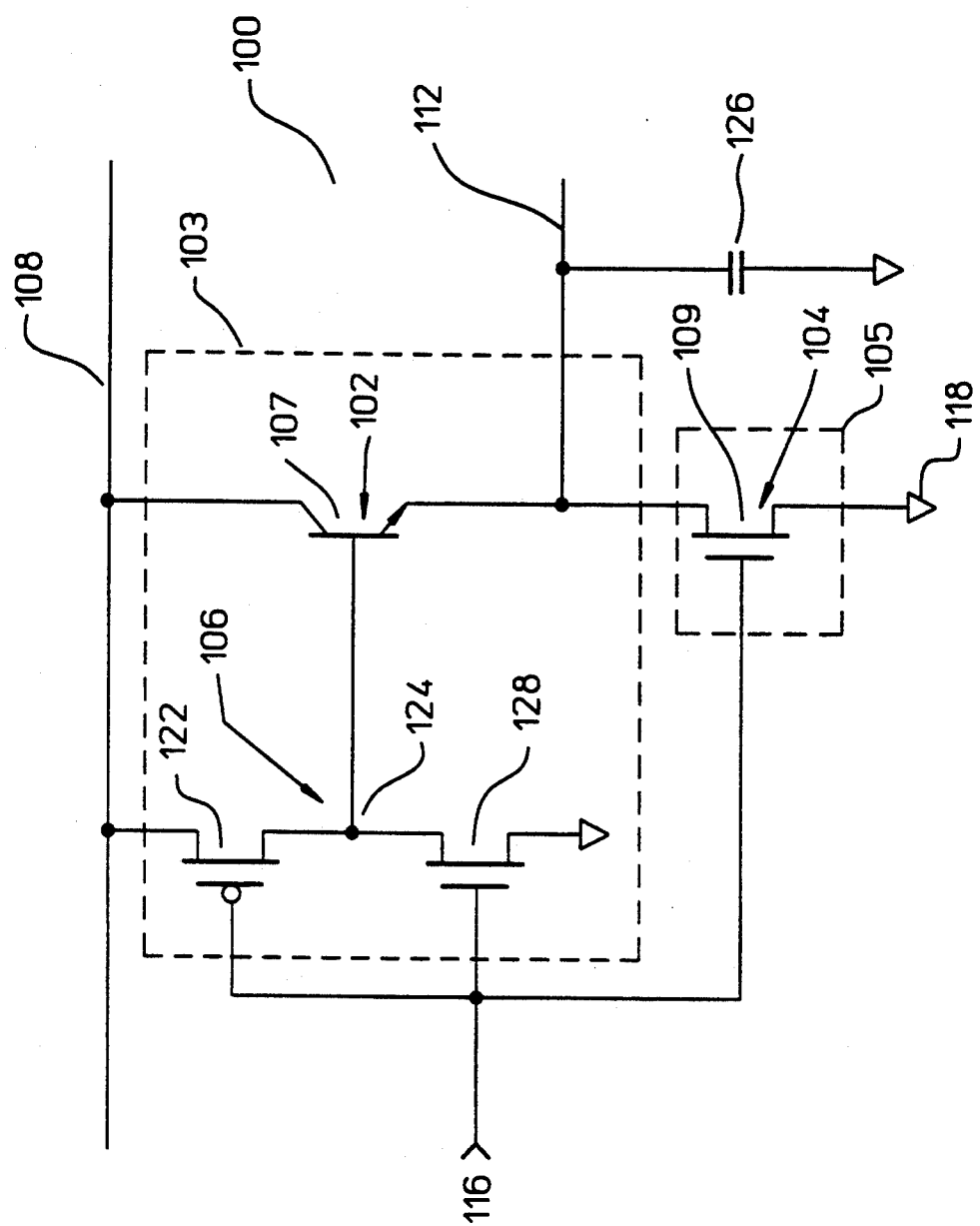
FIG. 1 shows a BiNMOS circuit illustrating the first preferred embodiment of the invention.

FIG. 1 shows a BiNMOS circuit illustrating the first preferred embodiment of the invention. The figure depicts a logic circuit 100 with a pull-up section 103 having a bipolar pull-up means generally 102 and a MOS pull-up means generally 106, and a pull-down section 105 having a MOS pull-down means generally 104. The bipolar pull-up means 102 preferably comprises a NPN bipolar pull-up transistor 107. The MOS pull-up means 106 preferably comprises a PMOS pull-up transistor 122 in series with a NMOS pull-up transistor 128. The MOS pull-down means 104 preferably comprises a NMOS pull-down transistor 109.

The bipolar pull-up transistor 107 is connected between a supply voltage terminal 108 and an output 112 of the circuit 100. The source of the PMOS pull-up transistor 122 is connected to the supply voltage terminal 108; its gate is connected to an input terminal 116 to receive an input signal, and its drain is connected to the base of the bipolar pull-up transistor 107. The drain of the NMOS pull-up transistor 128 is connected to the drain of the PMOS pull-up transistor 122; the gate of the NMOS pull-up transistor 128 is connected to the input terminal 116 to receive the input signal, and the source of the NMOS pull-up transistor 128 is connected to a ground terminal 118. The drain of the NMOS pull-down transistor 109 is connected to the output 112 of the circuit 100; its gate is connected to the input terminal 116 to receive the input signal, and its source is connected to the ground terminal 118.

In operation, if the input signal assumes a low logic level, the output 124 of the MOS pull-up means 106 goes to a high logic level. The bipolar pull-up transistor 107 responding to the high logic level provides a low resistance current path which establishes a high logic level at the output 112 of the circuit 100. For the pull-down transistor 109, if the input signal assumes the high logic level, the NMOS pull-down transistor 109 responding to the high logic level provides a low resistance current path which establishes the low logic level at the output 112 of the circuit 100.

The MOS pull-up means 106 is characterized by a first dimension which is the width Wp of the gate of the PMOS pull-up transistor 122. The NMOS pull-down transistor 109 is characterized by a second dimension which is the width Wn of the gate of the NMOS pull-down transistor 109. The bipolar pull-up transistor 107 is characterized by a third dimension which is the length of its emitter.

Figure 2A:
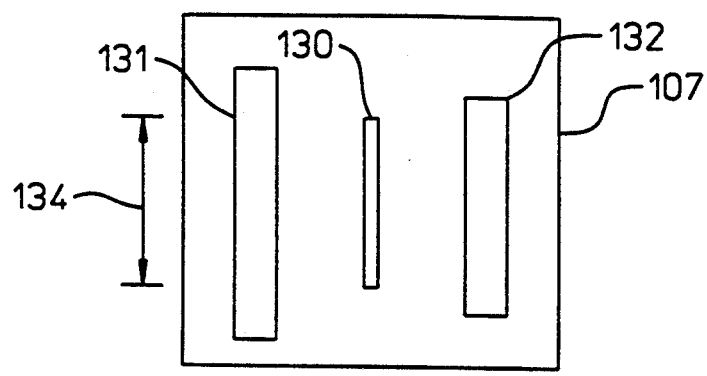
FIG. 2A-D show simplified layouts of the transistors in the first preferred embodiment of the invention.
Figure 2B:
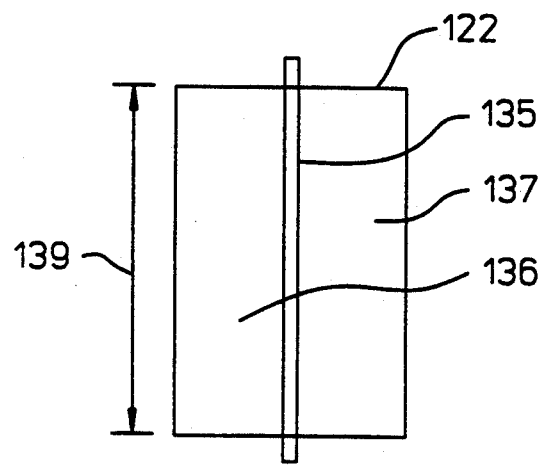
Figure 2C:
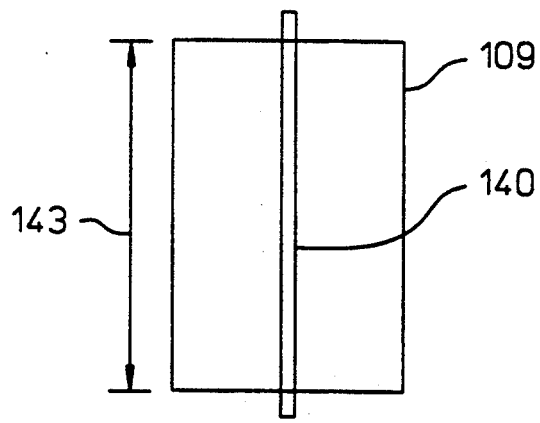
Figure 2D:
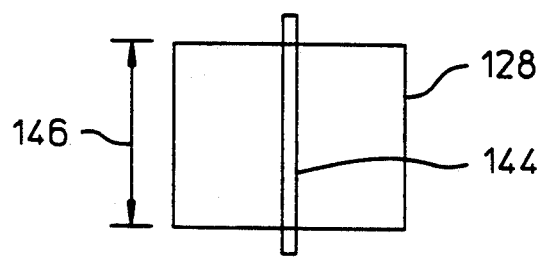

FIG. 2A–D show simplified layouts of the transistors illustrating the first, the second and the third dimension. FIG. 2A shows a layout of the bipolar pull-up transistor 107 with its collector 131, its base 132 and its emitter 130. The third dimension is its emitter length 134. FIG. 2B shows a layout of the PMOS pull-up transistor 122 with its drain 136, its source 137 and its gate 135. The first dimension is gate width 139. FIG. 2C shows a layout of the NMOS pull-down transistor 109 with its gate 140 and its gate width 143, the second dimension. FIG. 2D shows a layout of the NMOS pull-up transistor 128 with its gate 144 and its gate width 146.

The circuit 100 has a propagation delay. Typically, the propagation delay is represented by the average of the propagation delays of the input signal through the NMOS pull-down transistor 109 and through both the MOS pull-up means 106 and the bipolar pull-up transistor 107 to the output 112 of the circuit 100.

There is an optimum ratio for Wp/Wn which, relative to all other ratios, substantially minimizes the propagation delay of the circuit 100.

To further appreciate the advantages of the invention, three terms, namely mos-size, input capacitance and fanout, will be defined.

The mos-size Ms of the circuit 100 is the sum of the widths of the gates of all the MOS transistors receiving the input signal. With Wx as the width of the gate of the NMOS pull-up transistor 128, the mos-size Ms of the circuit 100 is (Wn+Wp+Wx).

The input capacitance Cin of the circuit 100 depends on the number of MOS transistors receiving the input signal and the size of the MOS transistors. Mathematically, Cin is proportional to the mos-size Ms of the circuit as follows:

$$Cin = Cox * L * Ms, \qquad (1)$$

where L=the length of the gate of one of the MOS transistors, assuming all having the same length; and Cox=the capacitance per unit area of the oxide of the gate of the MOS transistors.

The fanout F of the circuit 100 is defined as the ratio of its load capacitance 126 to its input capacitances. The load capacitance consists of all the capacitances at the output 112 which include parasitic capacitances and wiring capacitances. With a fixed input capacitance Cin, a large fanout implies a large load capacitance 126.

In a typical engineering design, mos-sizes, fanouts and bipolar emitter lengths are usually within certain ranges. For example, mos-sizes range approximately from 10 $\mu$m to 60 $\mu$m, fanouts range approximately from 1 to 10, and bipolar emitter lengths range approximately from 2 $\mu$m to 16 $\mu$m. Using such typical ranges, the optimum ratio is found empirically. This is done by modelling the circuit, simulating the model in a computer and selecting the ratio of Wp/Wn that substantially minimizes the propagation delay of the circuit at all the different combination of values of mos-sizes, fanouts and bipolar emitter lengths.

The propagation delay achieved by the selected ratio, defined here as the opt-delay, may not be the lowest, but the delay differs from the lowest propagation delay at any other ratio of Wp/Wn, defined here as the min-delay, by less than approximately 6%. With different ranges of mos-sizes, fanouts and bipolar emitter lengths, the percentage difference may be higher or lower than 6%; however there is still an optimum ratio that substantially minimizes the propagation delay of the circuit.

The empirically found optimum ratio is independent of the values of the mos-sizes, fanouts and emitter lengths. A mos-size depends on the sum of the first and the second dimension, a fanout depends on the load capacitance of the circuit and an emitter length is defined as the third dimension of the circuit. In a system with many circuits having the same configuration as the one shown in FIG. 1, every circuit would have substantially the same optimum ratio to minimize the propagation delay of each circuit even if some circuits have different mos-sizes, fanouts and emitter lengths.

The dimension of the NMOS pull-up transistor 128 is not as critical as the dimensions of the PMOS pull-up transistor 122 and the NMOS pull-down transistor 109. This is because the PMOS pull-up transistor 122 is used to "pull up" the voltage at the output 112 of the circuit to the high logic level, and the NMOS pull-down transistor 109 is used to "pull down" the voltage at the output 112 to the low voltage level. But, the NMOS pull-up transistor 128 is not used to "pull-up", nor is it used to "pull-down", it only has to be large enough to ensure that a low resistance current path is not created at the bipolar pull-up transistor 107 when the input signal is at the high logic level and the output 112 of the circuit 100 is in transition. It has been determined that a size of 0.3 of Wp for the width Wx of the gate of the NMOS pull-up transistor 128 is sufficient. So in a typical engineering design, Wx ranges from 0.3 to 0.5 of Wp without significantly affecting the optimum ratio of the circuit 100.

Based on the optimum ratio, the design of the circuit in FIG. 1 is tremendously simplified. As an example, given the following four conditions:

Goal of the design = minimize the propagation delay,
Empirically found optimum ratio = 1 to 1,
Mos-size = 23 μm, and
Wx = 0.3Wp, the characteristic dimensions Wp and Wn are solved by the following two equations:

$$Wp/Wn = 1 \text{ (the optimum ratio), and}$$

$$(Wp + Wn + 0.3Wp) = 23.$$

From the equations, Wp and Wn are 10 μm and the gate width of the NMOS pull-up transistor is 3 μm. Prior references have described the dimensional relationship between the MOS pull-up means 106 and the bipolar pull-up transistor 107. Thus the characteristic dimensions of the whole circuit are determined.

FIG. 1 illustrates the first preferred embodiment of the invention using three MOS transistors. More MOS transistors can be used as long as the circuit can be reduced back to the configuration shown in FIG. 1. Glasser and Dobberpuhl in "Design and Analysis of VLSI Circuits" have disclosed methods to reduce a plurality of transistors into an equivalent transistor. Basically the way is to replace transistors in series by an equivalent transistor and transistors in parallel by another equivalent transistor. This method is illustrated by a circuit shown in FIG. 3.

Figure 3:
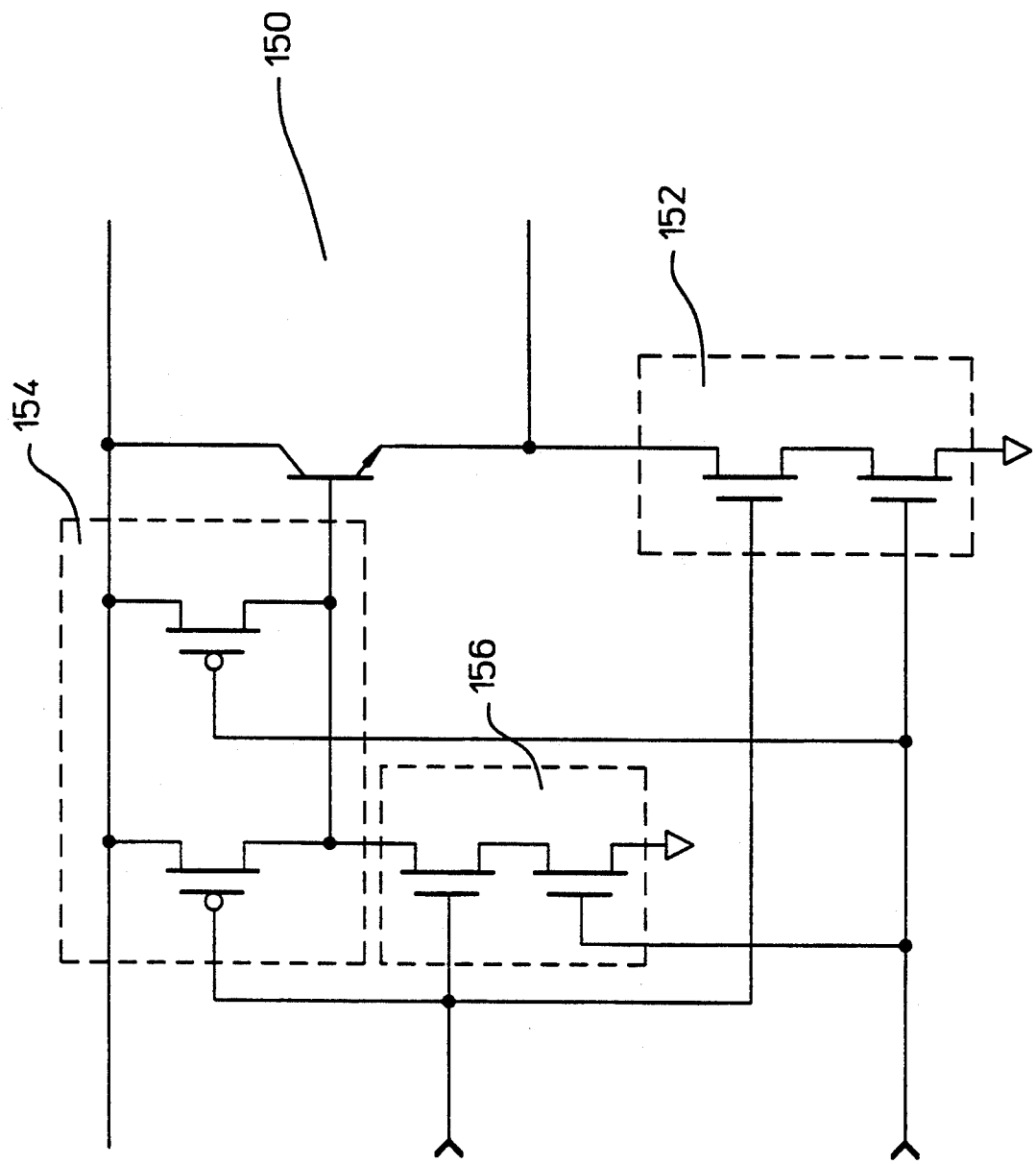
FIG. 3 depicts a dual input NAND gate having equivalent circuit configuration as the circuit in FIG. 1.

FIG. 3 depicts a dual input NAND gate 150. The MOS pull-down section 152 includes two NMOS transistors in series. The MOS pull-up means includes a PMOS pull-up device 154 and a NMOS pull-up devices 156. The PMOS pull-up devices 154 has two PMOS transistors in parallel, and the NMOS pull-up devices 156 has two NMOS transistors in series. Transistors grouped together by a box shown in FIG. 3 are assumed to be identical to each other. By replacing the grouped transistors that are in series by an equivalent transistor, and the grouped transistors that are in parallel by another equivalent transistor, the configuration of the circuit 150 in FIG. 3 becomes identical to that shown in FIG. 1. Then the present invention is applied to the simplified circuit. Due to the similarity of the configuration of the simplified circuit in FIG. 3 to that in FIG. 1, the simplified circuit in FIG. 3 has the same optimum ratio as that of the circuit in FIG. 1. From the optimum ratio, the characteristic dimension of each equivalent transistor is determined. Working backwards, the simplified version is expanded back to its original configuration with the characteristic dimension of each transistor determined to substantially minimize the propagation delay of the circuit. Other arbitrary combination of series or parallel transistors in complex circuits can be treated in a similar manner.

The value of the optimum ratio depends on the process technology. With a different technology, the model used to simulate the circuit is different which may change the value of the optimum ratio. Similarly, the difference between the opt-delay and the min-delay also depends on the process technology. However, there is still an optimum ratio that is independent of the values of the mos-sizes, fanouts and emitter lengths, and that substantially minimizes the propagation delay of the circuit. The optimum ratio, and the difference between the opt-delay and the min-delay also depend on the circuit configuration. The second preferred embodiment demonstrates the invention for a circuit configuration different from the first preferred embodiment.

Figure 4:
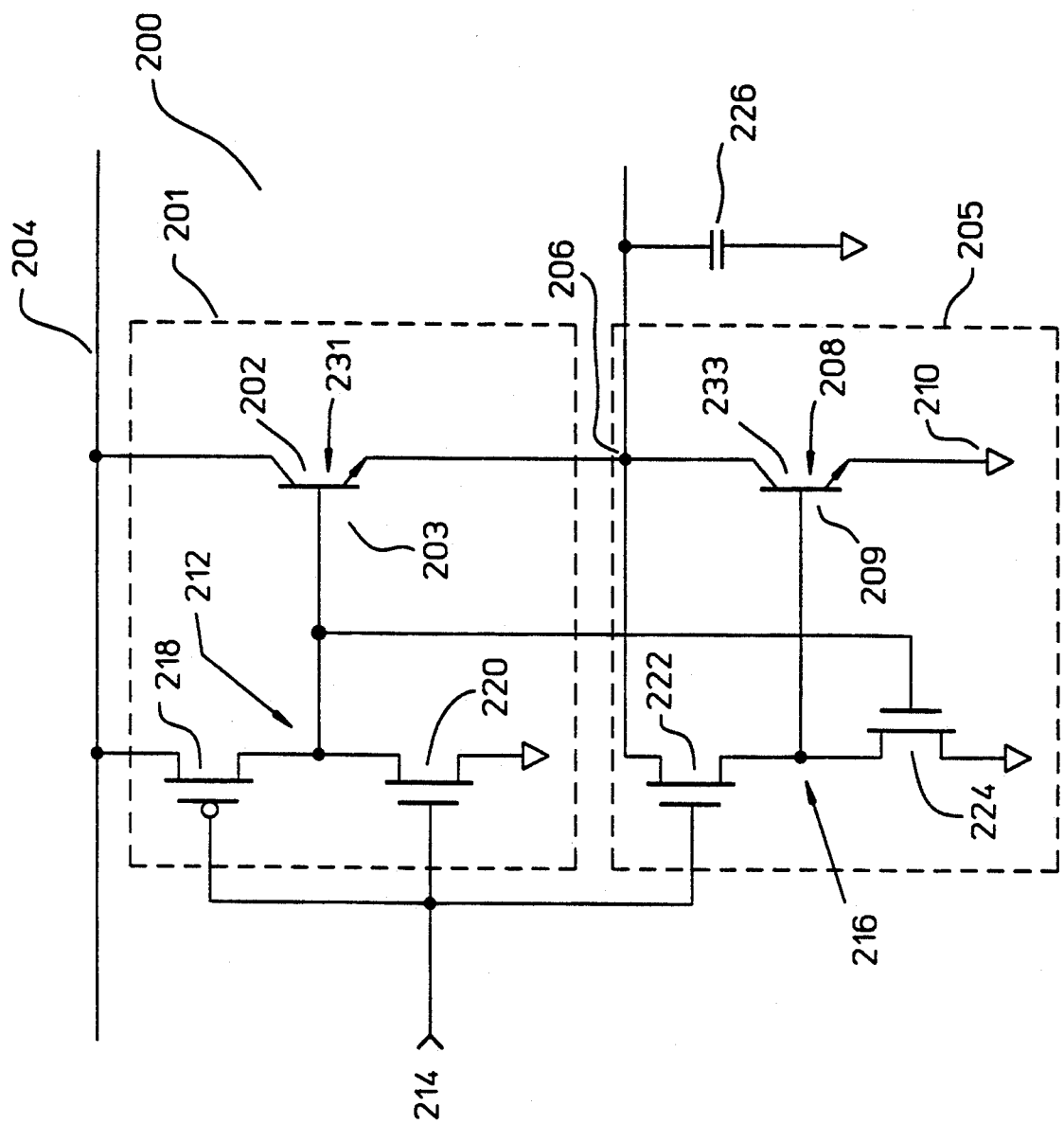
FIG. 4 shows a BiCMOS circuit illustrating the second preferred embodiment of the invention.

FIG. 4 shows a BiCMOS circuit 200 illustrating the second preferred embodiment of the invention. It has a pull-up section 201 having a bipolar pull-up means generally 231 and a MOS pull-up means generally 212, and a pull-down section 205 having a bipolar pull-down means generally 233 and a MOS pull-down means generally 216. The MOS means drive the bipolar means.

The bipolar pull-up means 231 comprises a NPN bipolar pull-up transistor 202 which is connected between a supply voltage terminal 204 and an output 206 of the circuit 204. The bipolar pull-down means 233 comprises a NPN bipolar pull-down transistor 208 which is connected between a ground terminal 210 and the output 206 of the circuit 200.

The MOS pull-up means 212 includes a PMOS pull-up transistor 218 and a NMOS pull-up transistor 220. Its configuration is identical to the MOS pull-up means 106 in the first embodiment.

The MOS pull-down means 216 includes a first 222 and a second 224 NMOS pull-down transistor. The drain of the first NMOS pull-down transistor 222 is connected to the output 206 of the circuit 200; its gate is connected to an input terminal 214 to receive an input signal, and its source is connected to the base 209 of the bipolar pull-down transistor 208. The drain of the second NMOS pull-down transistor 224 is connected to the base 209 of the bipolar pull-down transistor 208; the gate of the second NMOS pull-down transistor 224 is connected to the base 203 of the bipolar pull-up transistor 202 and the source of the second NMOS pull-down transistor 224 is connected to the ground terminal 210.

In operation, the MOS pull-up means 212 drives the bipolar pull-up transistor 202. The MOS pull-up means 212 also responds to the input signal forcing the bipolar pull-up transistor 202 to provide a low resistance current path for establishing a high logic level at the output 206 of the circuit 200 if the input signal assumes a low logic level.

In more detail, if the input signal assumes the low logic level, the PMOS pull-up transistor 218 operates to establish a low resistance current path between the supply voltage terminal 204 and the base 203 of the bipolar pull-up transistor 202. This places the high logic level at the base 203 which in turn establishes a high logic level at the output 206 of the circuit. If the input signal assumes the high logic level, the NMOS pull-up transistor 220 operates to establish a low resistance current path between the ground terminal 210 and the base 203 of the bipolar pull-up transistor 202.

The MOS pull-down means 216 drives the bipolar pull-down transistor 208. The MOS pull-down means 216 also responds to the input signal forcing the bipolar pull-down transistor 208 to provide a low resistance current path for establishing the low logic level at the output 206 of the circuit 200 if the input signal assumes the high logic level.

In more detail, the first NMOS pull-down transistor 222 operates to establish a low resistance current path between the output 206 of the circuit 200 and the base 209 of the bipolar pull-down transistor 208 if the input signal assumes the high logic level. The second NMOS pull-down transistor 224 operates to establish a low resistance current path between the base 209 of the bipolar pull-down transistor 208 and the ground terminal 210 if a low resistance current path is established between the supply voltage terminal 204 and the base 203 of the bipolar pull-up transistor 202.

The MOS pull-up means 212 is characterized by a first dimension, and the MOS pull-down means 216 is characterized by a second dimension. The first dimension is the width Wcp of the gate of the PMOS pull-up transistor 218, and the second dimension is the width Wcn of the gate of the first NMOS pull-down transistor 222. The dimension of the NMOS pull-up transistor 220 and the second NMOS pull-down transistor 224 are not as critical. They only have to be large enough to ensure that low resistance current paths are not unexpectedly created at their corresponding bipolar transistors when the output 206 of the circuit 200 is in transition. Thus, the width of the gate of the NMOS pull-up transistor 220 and the second NMOS pull-down transistor 224 can each range from 0.3 to 0.5 of Wcp without significantly affecting the optimum ratio of the circuit 200.

The bipolar pull-up transistor 202 is substantially the same as the bipolar pull-down transistor 208 and is characterized by a third dimension which is its emitter length.

There is an optimum ratio for Wcp/Wcn, which, relative to all other ratios, substantially minimizes the propagation delay of the circuit 200. This ratio is independent of the third dimension, the input capacitance and the fanout of the circuit 200. The input capacitance of the circuit is again defined by equation 1. The mos-size of the circuit 200 is the sum of the widths of the gates of the MOS transistors 218, 220 and 222 receiving the input signal. The fanout of the circuit 200 is again defined as the ratio of its load capacitance 226 to its input capacitance. With a fixed input capacitance, a large fanout implies a large load capacitance 226.

In a system with many circuits having the same configuration as the one shown in FIG. 4, every circuit would have substantially the same optimum ratio to minimize the propagation delay of each circuit even if some circuits have different mos-sizes, fanouts and emitter lengths.

Similar to the first embodiment, more transistors can be used for both the MOS pull-up and the MOS pull-down means. Such a more complicated circuit also has an optimum ratio if by reducing the transistors in series or in parallel to their equivalent transistor, the circuit configuration becomes identical to the one shown in Figure 4.

This invention is applicable to other digital circuits with configurations similar to BiCMOS or BiNMOS circuits. One example of such a circuit includes a PMOS pull-up transistor driving a NPN bipolar transistor with its emitter connected to an output of the circuit, and a NMOS pull-down transistor driving a PNP bipolar transistor with its emitter connected to the output of the circuit.

This invention shows that there is an optimum ratio relating the characteristic dimension of the MOS pull-up devices to the characteristic dimension of the MOS pull-down devices in a logic circuit with one or more bipolar devices connected to an output of the circuit. This optimum ratio substantially minimizes the propagation delay of the circuit.

Other embodiments of the invention will be apparent to the skilled in the art from a consideration of this specification or practice of the invention disclosed herein. It is intended that the specification and examples be considered as exemplary only, with the true scope and spirit of the invention being indicated by the following claims.

I claim:

1. A logic circuit comprising:
   a pull-up section including
   bipolar pull-up means connected between a first terminal and an output of the circuit;
   MOS pull-up means, characterized by a first dimension, driving the bipolar pull-up means and responding to an input signal to force the bipolar pull-up means to provide a low resistance current path for establishing a first logic level at the output if the input signal assumes a second logic level; and
   a pull-down section including
   MOS pull-down means, characterized by a second dimension, connected between the output of the circuit and a second terminal, the MOS pull-down means responding to the input signal to provide a low resistance current path for establishing the second logic level at the output if the input signal assumes the first logic level,
   such that
   the first and the second dimension are elated by an optimum ratio that substantially minimizes a propagation delay of the circuit;
   the sum of the first and the second dimension is proportional to an input capacitance of the circuit; and
   the optimum ratio is independent of a fanout which is defined as a load capacitance of the circuit divided by the input capacitance, the load capacitance being connected to the output of the circuit.

2. A plurality of logic circuits, each logic circuit as recited in claim 1 wherein:
   the optimum ratio is substantially the same in at least two of the logic circuits.

3. A plurality of logic circuits, each logic circuit as recited in claim 1 wherein:
   the optimum ratio is substantially the same in at least two of the logic circuits; and
   the optimum ratio is independent of the input capacitance.

4. A plurality of logic circuits, each logic circuit as recited in claim 1 wherein:
   the optimum ratio is substantially the same in at least two of the logic circuits;
   the bipolar pull-up means is characterized by a third dimension; and
   the optimum ratio is independent of the third dimension.

5. A logic circuit as in claim 1 wherein:
   the bipolar pull-up means comprises a bipolar transistor which has a base and an emitter; and
   the MOS pull-down means comprises a NMOS pull-down transistor which has a gate.

6. A logic circuit as in claim 5 wherein:
   the MOS pull-up means comprises a PMOS pull-up transistor and a NMOS pull-up transistor;
   the PMOS pull-up transistor has a gate and operates to establish a low resistance current path between the first terminal and the base of the bipolar transistor if the input signal assumes the first logic level; and
   the NMOS pull-up transistor operates to establish a low resistance current path between the second terminal and the base of the bipolar transistor if the input signal assumes the second logic level.

7. A logic circuit as in claim 6 wherein:
   the bipolar transistor comprises a NPN transistor;

the first dimension is the width of the gate of the PMOS pull-up transistor;

the second dimension is the width of the gate of the NMOS pull-down transistor;

the bipolar transistor is characterized by the length of its emitter; and the optimum ratio is independent of the emitter length.

8. A logic circuit comprising:

a pull-up section including bipolar pull-up means connected between a first terminal and an output of the circuit;

MOS pull-up means, characterized by a first dimension, driving the bipolar pull-up means and responding to an input signal to force the bipolar pull-up means to provide a low resistance current path for establishing a first logic level at the output if the input signal assumes a second logic level; and a pull-down section including bipolar pull-down means connected between a second terminal and the output of the circuit; and MOS pull-down means, characterized by a second dimension, driving the bipolar pull-down means and responding to the input signal to force the bipolar pull-down means to provide a low resistance current path for establishing the second logic level at the output if the input signal assumes the first logic level, the first and the second dimension being related by an optimum ratio that substantially minimizes a propagation delay of the circuit.

9. A plurality of logic circuits, each logic circuit as recited in claim 8 wherein:

the optimum ratio is substantially the same in at least two of the logic circuits;

the sum of the first and the second dimension is proportional to an input capacitance of the circuit; and the optimum ratio is independent of a fanout which is defined as a load capacitance of the circuit divided by the input capacitance, the load capacitance being connected to the output of the circuit.

10. A plurality of logic circuits, each logic circuit as recited in claim 8 wherein:

the optimum ratio is substantially the same in at least two of the logic circuits;

the sum of the first and the second dimension is proportional to an input capacitance of the circuit; and the optimum ratio is independent of the input capacitance.

11. A plurality of logic circuits, each logic circuit as recited in claim 8 wherein:

the optimum ratio is substantially the same in at least two of the logic circuits;

the bipolar pull-up means is substantially the same as the bipolar pull-down means and is characterized by a third dimension; and the optimum ratio is independent of the third dimension.

12. A logic circuit as in claim 8 wherein the bipolar pull-up means comprises a bipolar pull-up transistor which has a base and an emitter; and the bipolar pull-down means comprises a bipolar pull-down transistor which has a base and an emitter.

13. A logic circuit as in claim 12 wherein:

the MOS pull-up means comprises a PMOS pull-up transistor and a NMOS pull-up transistor;

the PMOS pull-up transistor has a gate and operates to establish a low resistance current path between the first terminal and the base of the bipolar pull-up transistor if the input signal assumes the first logic level;

the NMOS pull-up transistor operates to establish a low resistance current path between the second terminal and the base of the bipolar pull-up transistor if the input signal assumes the second logic level;

the MOS pull-down means comprises a first NMOS pull-down transistor and a second NMOS pull-down transistor;

the first NMOS pull-down transistor has a gate and operates to establish a low resistance current path between the output of the circuit and the base of the bipolar pull-down transistor if the input signal assumes the second logic level; and the second NMOS pull-down transistor operates to establish a low resistance current path between the base of the bipolar pull-down transistor and the second terminal if a low resistance current path is established between the first terminal and the base of the bipolar pull-up transistor.

14. A logic circuit as in claim 13 wherein:

the bipolar pull-up and the bipolar pull-down transistor are both NPN transistors;

the first dimension is the width of the gate of the PMOS pull-up transistor;

the second dimension is the width of the gate of the first NMOS pull-down transistor;

the bipolar pull-up transistor is substantially the same as the bipolar pull-down transistor, and is characterized by the length of its emitter; and the optimum ratio is independent of the emitter length.

* * * * *